Figures 1, 2:
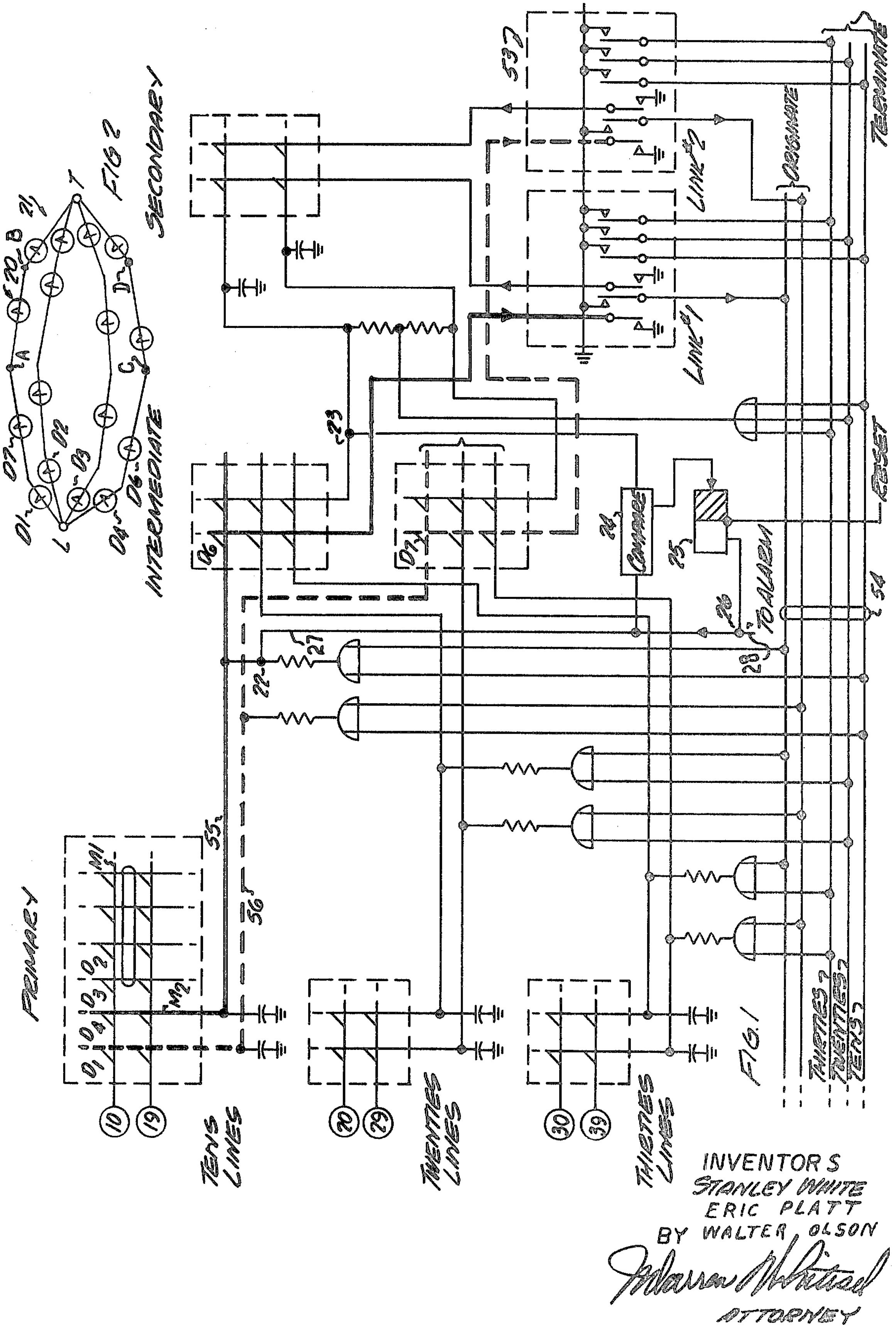

INVENTORS
STANLEY WHITE
ERIC PLATT
BY WALTER OLSON
ATTORNEY marked by the open state of the corresponding line gate ($G_l$), the unblocked condition of gate $G_{ll}$ coinciding with that of the line gate.

Gate $G_{ll}$ is controlled by an OR gate OG whose four inputs are tied to the outputs of responsive AND gates $AG_c$, $AG_r$, $AG_b$, $AG_d$; each of these AND gates has a first input connected to a corresponding wire $w_c$, $w_r$, $w_b$, $w_d$ and a second connected to a similarly designated lead $z_c$, $z_r$, $z_b$, $z_d$ (collectively labeled $g$) emanating from a set of pulse generators PG. These pulse generators operate continuously but are ineffectual as long as none of the associated AND gates is opened by an enabling signal from logic matrix LM. Their outputs have been illustrated in FIG. 2, by way of example, as respective modulating-pulse trains $T_c$, $T_r$, $T_b$ and $T_d$, it being understood that the length and spacing of these pulses are on the order of a second, as per conventional telephone practice, so that each pulse encompasses a large number of cycles of the output frequency of tone generator O.

The elements last described are also duplicated on the side of terminal E' where they have been designated by the same reference characters with the addition of prime marks.

The amplifier $A_o$ (or $A_o'$) may have the construction illustrated by way of example in FIG. 3. As shown there, this amplifier comprises two transistor stages 11 and 12, of opposite conductivity types, having their inputs connected in parallel across the output of oscillator O (or O'). The collector/emitter circuits of NPN transistor 11 and PNP transistor 12 are connected in series between a high-voltage bus bar 13 (here positive) and a grounded bus bar 14, the base of these transistors being tied to the ungrounded input terminal via respective coupling condensers 15 and 16. The input circuit of the amplifier further includes a pair of resistors 17 and 18 and a pair of diodes 19, 20 connected in series across the two bus bars, each transistor base being tied to the junction of one resistor and one diode. The common terminal of diodes 19 and 20 is returned to the two emitters through a further resistor 21, these emitters in turn being coupled through a condenser 22 to an output terminal 23.

The operation of the amplifier shown in FIG. 3 is as follows: During positive half-cycles of oscillator O, transistor 11 conducts and charges the condenser 22 positive; during negative half-cycles, transistor 12 conducts and reverses the polarity of the condenser charge. As long as terminal 23 remains insulated by the blocking of gate $G_l$ (or $G_l'$) connected thereto, the operation is virtually symmetrical so that the mean potential of condenser 22 is zero. Any unbalancing of the condenser potential by the opening of the gate during either positive or negative half-cycles is compensated by an increased conductivity of one or the other transistor.

Reference will now be made to FIG. 4 for a description of certain typical situations that may arise during signaling. Graph (a) of FIG. 1 shows the output oscillation of tone generator O over a period of time $t$ extending over more than one cycle of modulating pulse $T_c$, graph (b). During this period, a local line (say, line $L_n$) is to receive a calling signal as determined by enabling pulses on lead $w_c$ which coincide with the pulses $P_n$ (FIG. 1). The coincidence of these enabling pulses with a modulating pulse $T_c$ charges the line condenser $c_n$ during short periods as indicated by pulses $p_{cn}$ in graph (c) of FIG. 4. These pulses, when integrated in filter $F_n$, reconstitute the original audio wave of graph (a) so as to give rise to a series of tone signals having the rhythm of modulating pulses $T_c$.

If the same calling signal is to be transmitted concurrently to, say, line $L_l$, the resulting charging pulses for condenser $C_l$ will be staggered with reference to pulses $P_{cn}$ as indicated at $P_{cl}$ in graph (d).

If, on the other hand, the second subscriber (line $L_l$) is to receive a different tone signal, e.g. a "line release" signal as represented by modulating pulses $T_r$ in graph (e), the resulting charging pulses $P_{rl}$ will occur in the same time slots as the pulses $P_{cl}$ in the previous instance but will be present during different periods of time as indicated in graph (f).

Graph (g) of FIG. 4 shows the simultaneous transmission of calling signals to lines $L_n$ and $L_l$, resulting in the interleaving of pulses $P_{cn}$ and $P_{cl}$; within any clock cycle of duration, under the conditions previously assumed, up to approximately 100 pulse trains may thus be concurrently transmitted.

Graph (h), similarly, shows the interleaving of pulses $P_{cn}$ and $P_{rl}$ from graphs (c) and (f) during transmission of two different tone signals $L_n$ and $L_l$. It will be apparent that, by the technique described above, such chopped tone signals may also be transmitted in interleaved relationship from terminal E to any called subscriber associated with that terminal or to any remote station associated with terminal E'.

We claim:

1. A telecommunication system comprising a terminal; a plurality of local lines ending at said terminal; first gate means individual to each of said lines; timer means for sequentially opening same during consecutive sampling intervals forming part of a clock cycle; individual condenser means for each of said lines connected to said first gate means thereof for receiving samples of messages, transmitted from said terminal to said lines, during the corresponding sampling intervals; filter means in series with said condenser means for integrating the message samples received during successive clock cycles; tone-generating means at said terminal connectable to any of said lines via said first gate means, said tone-generating means having an operating frequency of a period substantially greater than a clock cycle; second gate means common to all said lines interposed between said tone-generating means and said first gate means; a source of modulating pulses of a duration substantially exceeding said period; and actuating means for opening said second gate means during selected sampling intervals under the joint control of said timer means and said modulating pulses, thereby generating a series of characteristic tone signals in the output of said filter means.

2. A system as defined in claim 1 wherein said tone-generating means comprises a single generator of audiofrequency oscillation.

3. A system as defined in claim 1, further comprising capacitive means common to all said lines connected across said tone-generating means ahead of said first gate means, said second gate means including a charging gate between said tone-generating means and said capacitive means and a discharging gate between said capacitive means and said first gate means.

4. A system as defined in claim 3 wherein said charging gate is connected to said timer means for periodic opening thereby between consecutive sampling intervals, said actuating means comprising a source of enabling pulses timed to coincide with said selected sampling intervals and logical circuitry for simultaneously applying said enabling and modulating pulses to said discharging gate.

5. A system as defined in claim 4 wherein said source of modulating pulses comprises a plurality of pulse generators of different rhythm, said source of enabling pulses comprising a logic network with several output leads, said logical circuitry including a like plurality of AND gates each having inputs connected to a respective one of said leads and to the output of a respective one of said pulse generators.

6. A system as defined in claim 5 wherein said logical circuitry further includes an OR gate with a plurality of inputs respectively connected to the outputs of said AND gates and with an output controlling said discharge gate.

7. A system as defined in claim 4, further comprising predominantly resistive impedance means in series with said charging gate and predominantly inductive impedance means in series with said discharging gate for enabling an aperiodic charging and a resonant discharging of said capacitive means.

8. A system as defined in claim 7 wherein said predominantly resistive impedance means includes an amplifier with two transistor stages of opposite conductivity types connected in parallel across said tone-generating means.

MONITOR AND ALARM CIRCUIT FOR SELF-SEEKING NETWORK

This invention relates to electronic switching networks, and more particularly to means for monitoring cross-point operation in self-seeking networks.

A recently developed electronic switching telephone system uses a self-seeking network wherein cross-points turn themselves on and off so that switch paths are able to select themselves. Other developments provide prewired patterns of connections which inhibit searching over useless cross-points. Examples of these systems are disclosed in the following U.S. patents and applications which are owned by the assignee of this invention:

3,204,044 (Aug. 31, 1965)—V. E. Porter—*Electronic Switching Telephone System*

3,221,104 (Nov. 30, 1965)—E. G. Platt et al.—*Electronic Switching Telephone System*

Ser. No. 584,140 (Oct. 4, 1966)—N. L. Jovic—*Multistage Electronic Switching Network*

Ser. No. 523,999 (Feb. 1, 1966)—W. K. C. Yuan et al.-—*Electronic Switching System*

The Platt et al. patent shows an exemplary two-and-three-stage network having a plurality of gates for controlling the application of enabling potentials to the network. Jovic and Yuan et al. show four-stage networks. To facilitate an explanation of the invention, it is convenient to describe the subject invention as if it were added to that Platt et al. network. However, it should be understood that the invention has equal applicability to the other and comparable networks. Moreover, the subject monitor circuit may be used at any convenient points in the network.

More specifically, a switching network of the described type uses cross-points which turn themselves on and off with virtually no in-network controls. Since there is a small amount of such controls, there is no immediately apparent indication of cross-point malfunctions. Hence, it is difficult to detect cross-points elements which burn out or improperly remain in either an open switch or a closed switch condition. Moreover, if there is such a malfunction, the prior systems have been left to the mercy of chance. For example, if a faulty cross-point should fail in a closed condition, perhaps a great number of parallel connected cross-points would also be shorted out. On the other hand, if the faulty cross-point should fail in an open condition, perhaps an undue number of paths would be rendered inoperative.

Accordingly, an object of the invention is to provide new and improved electronic switching telephone systems. More particularly, an object is to monitor the potentials at network node points and to indicate nonstandard potentials which represent malfunctions or cross-point failures, as they occur. Here, an object is to give an alarm when such failures occur. In this connection, an object is to automatically switch a network to a predetermined state when such failures occur.

In keeping with an aspect of this invention, cross-points are connected to vertical busses which apply a control potential to one side of each of a number of parallel connected cross-points. Each vertical bus connects to an inlet of a succeeding stage where another vertical bus serves a similar function. When all cross-points in a switch path are idle or when a path is completed, the successive vertical buses have substantially the same potentials thereon. By comparing the potentials on these busses, it is possible to detect malfunctions where the faulty cross-points are either open or shorted, and the vertical bus potentials are different. Responsive to such a detection of different potentials, an alarm may be given to indicate the malfunction, and a clamping potential may be applied to a vertical bus in order to keep the associated cross-points in a predetermined state of enabled operativeness or inhibited inoperativeness, as required.

The above mentioned and other features and objects of this invention and the manner of obtaining them will become more apparent, and the invention itself will be best understood by reference to the following description of an embodiment of the invention taken in conjunction with the accompanying drawings, in which:

FIG. 1 is a schematic circuit drawing which shows the invention as applied to the above cited Platt et al. network; and FIG. 2 is a linear graph which helps explain how the invention may be used to monitor the conditions of the resulting switch paths through the Platt et al. network.

For convenience of description, FIG. 1 of the attached drawing is copied directly from part of FIG. 1 of the Platt et al. patent. Therefore, it is thought that there is no need to explain this FIG. in great detail because reference may be made to U.S. Pat. No. 3,221,104 for such detail.

Briefly, FIG. 1 shows a plurality of cascaded matrices or switching arrays arranged to give automatic telephone service. The FIG. includes a plurality of subscriber lines arranged in groups of tens, i.e. a first group of 10 subscriber lines are numbered 10—19, a second group of 10 subscriber lines are numbered 20—29, and a third group 30—39. Other lines may, of course, be added, enlarged or reduced, in size.

Three cascaded stages of switching matrices or switching arrays are here designated "PRIMARY," "INTERMEDIATE," and "SECONDARY." A number of link circuits 53 control the extension of calls between subscriber lines and provide necessary or desirable call functions such as: dial tone, busy tone, conversation timing, or the like. A number of common buses 54 interconnect the links and matrices to transmit matrix inhibiting signals.

To request a switching path through these cascaded matrices, one end of the desired path is marked from a subscriber line, and the other end is marked from an allotted link circuit. For example, a calling subscriber at station 10 may remove a receiver or handset from a hook switch and cause an associated line circuit to mark multiple M1. A link allotter may close a contact to mark an inlet to link 01. The path will be extended through the matrices in a one-way direction (i.e. from the lines toward the links).

Each matrix includes first and second (or horizontal and vertical) multiples, two of which are shown at M1, M2 respectively. These multiples (which may be conductor buses) are arranged to provide a number of intersecting cross-points, one of which is shown at D1. At each cross-point, an electronic switch such as PNPN diode, for example, is connected between the intersecting multiples. Thus, when the switch is turned "on," the intersecting multiples are electrically connected, and when the switch is turned "off," the intersecting multiples are electrically isolated from each other.

These electronic switches turn "on" or fire when a voltage in excess of a "firing" potential is applied across their terminals. In greater detail, the idle vertical multiples are biased by a first or common reference potential, about which more will be said later. Therefore, a cross-point diode switch fires when a horizontal multiple is marked by a second potential which exceeds a firing potential relative to the vertical marking or common reference potential. After a cross-point fires, the marking potential on the horizontal multiple charges a capacitor connected to the intersecting vertical multiple. When the capacitor charges sufficiently, a firing voltage appears on a horizontal multiple of the cascaded matrix. Thus, the marking potential is passed on step-by-step to each succeeding cascaded matrix where other diodes fire in a similar manner.

Upon reflection, it will be apparent that any unrestricted self-seeking path may include many combinations of diodes scattered throughout the cascaded matrices. In view of the randomness of the diode selection, there is a good chance that some possible diode firings will be in useless dead end paths with respect to any two marked end points. Other diode firings will be in useful paths which actually do extend between these end points.

To preclude a search over a dead end path, a prewired network of gates is connected from the marked link to the particular verticals having access to that specific link. When the link marks the end of the network, it also applies an enabling potential to those verticals.

Thus, by way of example, the drawing includes one path shown by a heavily inked solid line 55 which extends from line 10 to link 01 and another shown by a heavily inked dashed line 56 extends from line 10 to link 02. The solid line 55 is a dead end path with respect to link 02, and the dashed line 56 is a dead end path with respect to link 01.

The effect of the gates is to inhibit a selection of dead end paths, such as the solid line 55, and to enable a selection of useful paths, such as the dashed line 56, when the link 02 is the desired end point. Conversely, the gates inhibit path 56 and enable path 55 when link 01 is the desired end point.

FIG. 2 shows a linear graph which helps explain the process. As pointed out above, the Platt et al., Jovic and Yuan et al. inventions include circuits which are equivalent for present purposes. However, there are also distinctions between them, one distinction being that Platt et al. show two stages in an originating part of the network and three stages in the terminating part. Jovic and Yuan et al., on the other hand, show four stages for every path. Therefore, to emphasize the equivalent nature of this aspect of these inventions, FIG. 2 shows a four stage linear graph relevant to the Jovic and Yuan et al. types of circuit.

Each of four segmented lines in FIG. 2 represents a different path through four stages in a switching network. The four diodes D1—D4 represent the four diodes marked D1—D4 in FIG. 1. The second segmented sections, including the diodes D6—D7, is the same as the stage including the diodes in FIG. 1. Likewise, the remaining stages 20, 21 represents the tertiary and quaternary stages in the Jovic and Yuan et al. network.

Here, the end point L represents a line and the end point T represents a link. Between these two points there are a discrete number of useful paths—four paths in this particular case. Only those four useful paths are enabled which extend from the point L to the point T. Hence, if one path, is selected, it includes the node points A, B; if another path is selected, it includes the node points C, D. In like manner, any other path also includes known node points. Each node points is the same as a vertical bus.

Before a path is completed, the associated cross-points are turned off, and an idle potential appears on each vertical bus node point. After a path is completed, each associated cross-point is turned on, and a busy potential appears on each vertical bus node point. Either way, a properly functioning cross-point is indicated when the substantially same potential appears at the node points A, B (or C, D). Or, conversely stated, a malfunction is indicated if substantially different potentials appear at these two node points in any given path.

According to an aspect of the invention, a comparison circuit 24 is connected between the node points 22, 23 (which correspond to two node points—such as A, B or C, D—in FIG. 2). As long as the comparison circuit detects the same potential at the points 22, 23, there is a proper and nonfaulty operation. On the other hand, if there is a faulty cross-point operation, the potentials at the points 22, 23 are different. The comparison circuit 24 responds to this detection of different potentials, and sets a flip-flop circuit 25 from its shaded to its unshaded sides.

Responsive to this flip-flop operation, a clamp potential is applied over wire 27 to maintain a predetermined potential to the point 22. Also a potential is applied to the wire 28 gives an alarm indicating a malfunction. This alarm informs a service man about the need for maintenance.

The clamping potential applied to the node 22 either permanently inhibits or permanently enables according to the logical needs of the system. For example, a permanent enable at the point 22 may allow the system to seek another path. However, there is no point in a permanent enable at the point 23 because this point is not part of an alternative to the faulty path. Hence, it is logical for the flip-flop 25 to apply an enabling clamping potential at the point 22 and an inhibiting clamping potential at the point 23.

The foregoing speaks of specific details such as four exemplary paths (FIG. 2), whereas any suitable number of paths may be provided. Likewise, a single comparison circuit 24 has been shown, where as a suitable number of comparison circuits may be provided.

While the principles of the invention have been described above in connection with specific apparatus, it is to be understood that this description is made only by way of example and not as a limitation on the scope of the invention.

I claim:

1. A self-seeking network for completing alternative paths between selected end points, comprising a plurality of stages, each stage comprising a plurality of cross-points individually operable to complete a path therethrough, wherein an idle cross-point is biased to a first potential and an operable cross-point is biased to a second potential, means for monitoring the bias at selected cross-points along idle and completed paths for potential differences between selected cross-points of different stages, means responsive to said monitoring means sensing different potentials between stages on a particular path for activating an alarm, and means responsive to the activation of an alarm for applying a clamping potential across the cross-points of the path over which potential differences were sensed.

2. A switching network comprising a plurality of cascaded switching stages, each of said stages including a plurality of buses each having a number of electronic switches connected thereto, means including said buses for biasing said switches either to a first potential indicating that the switches to which the potential is applied are available for use in a path through the network, or a second potential indicating that the switches are busy and thereby inhibited from use in a possible path through said network, and wherein the buses in available paths normally have substantially said first potential applied thereacross, means for advancing a path through separate stages by buses available for use by applying said second potential to switches in said stage, means for inhibiting an application of said second potential to buses which cannot be made part of a path through said network, means for sensing any potential difference between buses of separate stages within possible paths, and means responsive to the sensing of substantially different potentials between buses in succeeding cascaded stages of possible paths for giving an alarm and applying a clamping potential across the buses having said different potentials.

3. The network of claim 2, wherein said clamping potential is said first potential at stages near the start of the cascaded network and said second potential at stages near the end of the network.

4. The network of claim 2, wherein said first potential is below the conduction level of switches to which applied and said second potential is at least equal to the conduction level of switches to which it is applied.

5. The network of claim 2, wherein said switches in each stage comprise a cross-point matrix of PNPN diodes.